United States Patent
Mohammad

Patent Number: 5,426,316
Date of Patent: Jun. 20, 1995

[54] TRIPLE HETEROJUNCTION BIPOLAR TRANSISTOR

[75] Inventor: S. Noor Mohammad, Hopewell Junction, N.Y.

[73] Assignee: International Business Machines Corporation, Armonk, N.Y.

[21] Appl. No.: 255,695

[22] Filed: Jun. 8, 1994

Related U.S. Application Data

[63] Continuation of Ser. No. 994,028, Dec. 21, 1992, abandoned.

[51] Int. Cl.$^6$ .................. H01L 27/082; H01L 29/12; H01L 29/167
[52] U.S. Cl. .................................. 257/197; 257/198; 257/19
[58] Field of Search .................. 257/197, 198, 15, 19, 257/18, 14, 616

[56] References Cited

U.S. PATENT DOCUMENTS

| | | | |
|---|---|---|---|
| 3,275,906 | 9/1966 | Matsukura et al. | 317/234 |
| 4,482,910 | 11/1984 | Nishizawa et al. | 257/197 |
| 4,529,455 | 7/1985 | Bean et al. | 148/175 |
| 4,675,709 | 6/1987 | Scifres et al. | 257/15 |
| 4,688,068 | 8/1987 | Chaffin et al. | 257/15 |
| 4,771,326 | 9/1988 | Curran | 257/197 |
| 4,937,204 | 6/1990 | Ishibashi et al. | 437/110 |
| 5,006,912 | 4/1991 | Smith et al. | 257/197 |

OTHER PUBLICATIONS

H. Kroemer, "Heterostructure Bipolar Transistors and Integrated Circuits" Proceedings of the IEEE, vol. 70, No. 1, Jan. 1982, pp. 13-25.

T. J. Drummond, et al., "Use of a Superlattice to Enhance the Interface Properties Between Two Bulk Heterolayers" Appl. Phys. Lett. 42(7), Apr. 1, 1983, pp. 615-617.

S. L. Wright, et al., "Molecular Beam Epitaxial Growth of GaP on Si" J. Appl. Phys. 55 (8), Apr. 15, 1984, pp. 2916-2927.

H. Unlu, et al., "Band Discontinuities as Heterojunction Device Design Parameters" IEEE Transactions on Electron Devices, vol. ED-33, No. 5, May 1986, pp. 616-619.

T. Tatsumi, et al., "Si/Ge$_{0.3}$Si$_{0.7}$/Si Heterojunction Bipolar Transistor made with Si Molecular Beam Epitaxy" Appl. Phys. Lett. 52 (11), Mar. 14, 1988, pp. 895-897.

G. L. Patton, et al., "Silicon-Germanium-Base Heterojunction Bipolar Transistors by Molecular Beam Epitaxy" IEEE Electron Device Letters, vol. 9, No. 4, Apr. 1988, pp. 165-167.

J. D. Cressler, et al., "Sub-30-ps ECL Circuit Operation at Liquid-Nitrogen Temperature Using Self-Aligned Epitaxial SiGe-Base Bipolar Transistors" IEEE Electron Device Letters, vol. 12, No. 4, Apr. 1991, pp. 166-168.

G. L. Patton, et al., "Modulation-Doped Superlattice Base Heterojuntion Bipolar Transistor (MODHBT)" IBM Technical Disclosure Bulletin. vol. 32, No. 3B, Aug. 1989, pp. 128-131.

*Primary Examiner*—Rolf Hille
*Assistant Examiner*—Wael M. Fahmy
*Attorney, Agent, or Firm*—Charles W. Peterson, Jr.

[57] ABSTRACT

A vertical Triple Heterojunction Bipolar Transistor (THBT) and method of fabrication therefor. The THBT collector has a substrate layer of N+ silicon, an N− silicon layer grown on the substrate and a Si/SiGe superlattice grown on the N− silicon layer. The THBT base is layer of P+SiGe grown on the superlattice. The THBT Emitter is a second Si/SiGe Superlattice grown on the base layer. An N− silicon layer is grown on the emitter superlattice. A layer of N+ GaP grown on that N− Si layer. The base is formed, first, by etching a rectangular groove through the emitter, ion implanting dopant into the base layer to form an extrinsic base, etching a V shaped groove into the extrinsic base and, then, filling the grooved base with doped polysilicon.

8 Claims, 8 Drawing Sheets (PRIOR ART)
FIG. 1A

TRIPLE HETEROJUNCTION BIPOLAR TRANSISTOR

This is a continuation application of U.S. Patent Application Ser. No. 07/994,028, filed on Dec. 21, 1992 now abandoned.

FIELD OF THE INVENTION

The present invention relates, in general, to heterojunction bipolar transistors and in particular, to heterojunction bipolar transistors of two or more semiconductor materials and the process of manufacture therefor.

BACKGROUND OF THE INVENTION

Bipolar transistors are known in the art. Wide bandgap bipolar transistors are known in the art as Heterojunction Bipolar Transistors (HBTs). The bandgap of an HBT's emitter region is wider than the bandgap of its base region. This bandgap difference in an npn HBT creates a barrier to the hole injection from the base to the emitter. Consequently, HBTs have a high emitter injection efficiency, $\alpha$, and a correspondingly high static current gain, $\beta$. Thus, HBTs have a high current drive capability, a low sensitivity to output loading, and a turn-on voltage that is nearly independent of junction current. HBT design is, primarily, a balance of 3 design parameters: the static current gain $\beta$; base resistance $R_b$; and the emitter-base junction capacitance, $C_{eb}$.

HBT's perform better than other types of bipolar transistors in high-frequency, microwave applications. At high frequencies, other types of Bipolar transistors are lossy and inefficient. To compensate for that inefficiency at high frequency, in other types of bipolar transistors the ratio of the doping concentrations in the emitter and the base is made large, and the emitter width is made small. Because they have a higher current gain and are not sensitive to switching speed, HBTs may remain small, providing an advantage over other types of Bipolar transistors.

Figure 1A:
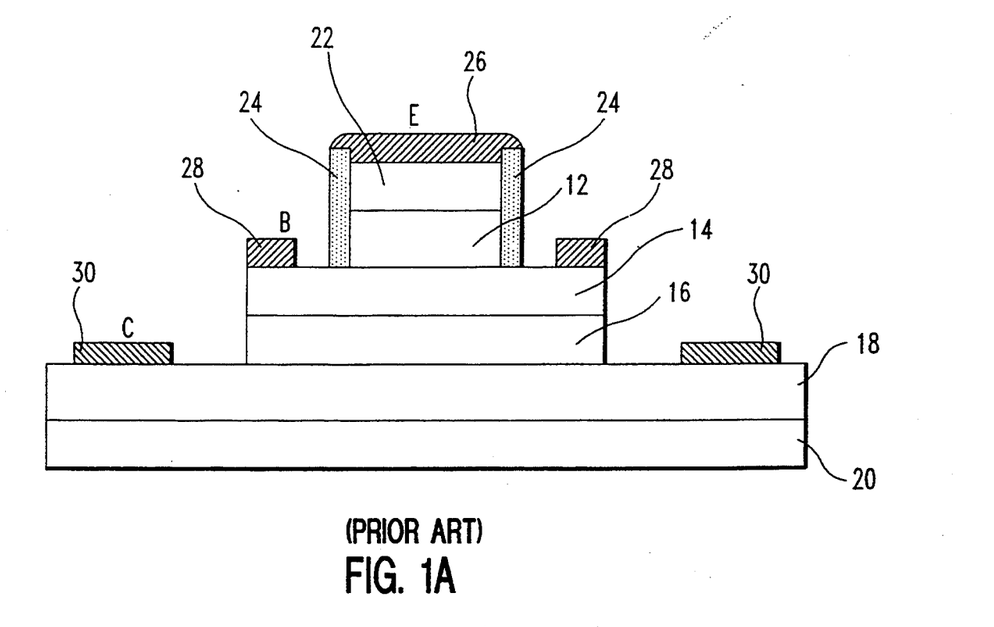
FIG. 1 is a cross-sectional view of a prior art AlGaAs/GaAs/GaAs HBT.

However, prior art HBTs also have problems. For example, $Al_zGa_{1-z}As$/GaAs HBT 10 (where z is the mole fraction of aluminum in AlGaAs) have a nonplanar structure as shown in FIG. 1, requiring a complex fabrication process. The HBT 10 has an N-type emitter 12, p+ base 14, and N-type collector 16 on an N+ subcollector 18. The subcollector 18 is on a semi-insulating GaAs substrate 20. The emitter 12 has an N+ cap 22 and $SiO_2$ side walls 24. The emitter 12, base 14 and collector 16 have metal or resistive contacts 26, 28, and 30, respectively. Because of its nonplanar structure, the regions between the HBT's emitter 12 and extrinsic base 14 are exposed, acting as electron-hole recombination sources.

Other prior art HBT structures have equally troublesome electron-hole recombination sources. For example, there is a high lattice mismatch between Si and Ge in the SiGe base for $Si/Ge_xSi_{1-x}$/Si HBTs (x being the Ge mole fraction in SiGe). This mismatch causes strain at Si/SiGe interfaces, both at the emitter-base and the base-collector junctions. This strain is a source of electron-hole recombination in each junction's space charge region. Consequently, because of that recombination, these prior art HBTs had reduced current density.

PURPOSES OF THE INVENTION

It is a purpose of the invention to improve high frequency bipolar transistors.

It is another purpose of the invention to improve bipolar transistor emitter efficiency.

It is yet another purpose of the invention to reduce parasitic electron-hole recombination in heterojunction bipolar transistors.

It is yet another purpose of the invention to improve bipolar transistor switching characteristics.

BRIEF DESCRIPTION OF THE DRAWINGS

While the specification concludes with claims particularly pointing out and distinctly claiming that, which is regarded as the present invention, the preferred embodiments of the invention may be more readily ascertained from the following technical description when read with the following drawings wherein:

SUMMARY OF THE INVENTION

The present invention is a Triple Heterojunction Bipolar Transistor and the method of fabrication, therefor, the THBT is fabricated by: growing a first superlattice on a layer of a first semiconductor material; growing a base layer of a second semiconductor material on said superlattice; growing a second superlattice on said base layer; growing a top layer of said first semiconductor material on said second superlattice; and defining an intrinsic base in said base layer.

DESCRIPTION OF THE PREFERRED EMBODIMENT

Figure 2A:
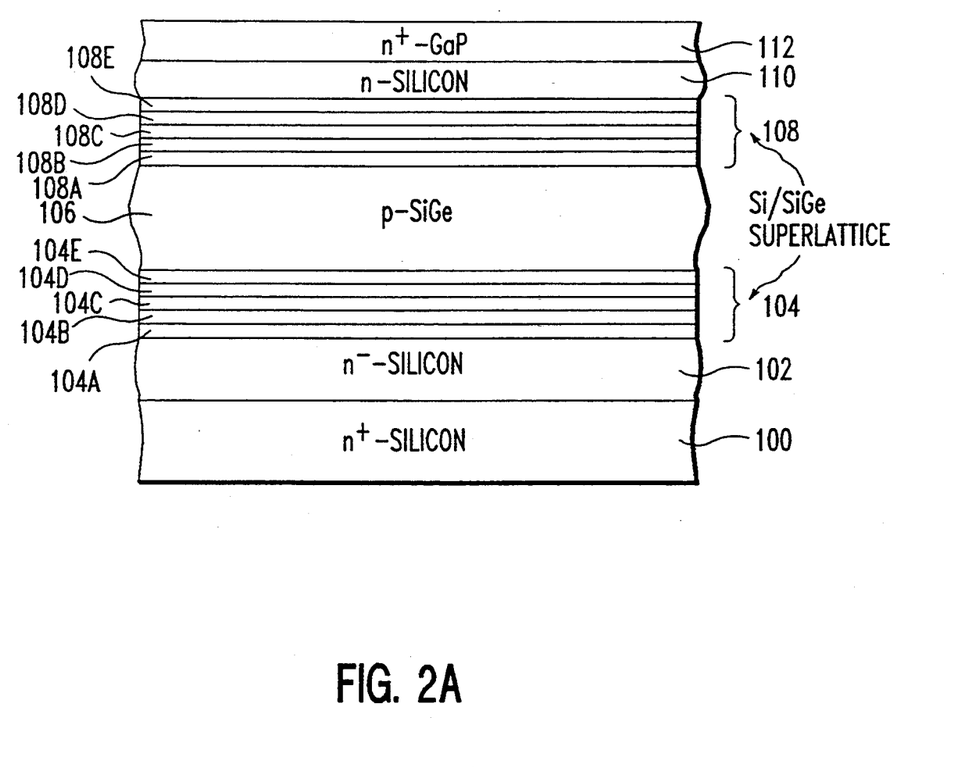
FIGS. 2A-2G are cross-sectional views of a heterojunction bipolar transistor at various steps of manufacture according to the present invention.

In the preferred embodiment of the present invention, a Triple Heterojunction Bipolar Transistor (THBT) is fabricated in a layered semiconductor structure. The first layer 100 in FIG. 2A, is a 2.2 $\mu$m thick substrate of N+ Silicon doped at a density of $5 \times 10^{18}/cm^3$. Next, a 0.5-0.8 $\mu$m thick N− layer 102 is grown on the substrate 100. The N− layer 102 is doped to a preferred density of $10^{17}/cm^3$. A first superlattice 104 of k periods of $Si/Si_{1-y}Ge_y$ (where y is the mole fraction of Germanium in SiGe in in the period), is grown on the n− layer 102. A 30-100 $\mu$m thick layer 103 of P type $Si_{1-x}Ge_x$ layer 106 (where x is the mole fraction of Ge) doped to a preferred density of $5 \times 10^{18}/cm^3$ is grown on the first superlattice layer 104. Then, a second superlattice 108 of m periods of $Si/Si_{1-z}Ge_z$ (where z is the mole fraction of Ge in the period), is grown on the P type SiGe layer 106.

Each period in both superlattices 106 and 108 has a 10-15 Å thick quantum well and a dopant density of $10^{16}/cm^3$. In the preferred embodiment, y monotonically increases and, z monotonically decreases, as each layer of each of the superlattices 104 and 108 is grown. For the first superlattice 104, this can be described mathematically as: $y = vx/(k+1)$, where k is the number of periods in the first superlattice 104, y is the mole fraction for the vth period of SiGe, and, v is an integer between 1 and k; and, for the second superlattice 108, $z = x - nx/(m+1)$, where m is the number of periods in the second superlattice 108, z is the mole fraction for the nth period and, n is an integer between 1 and m. In the preferred embodiment of the present invention, m=k=5 and x=0.18. It is contemplated that neither k nor m exceed 8. Thus, for each of the SiGe layers 104A, 104B, 104C, 104D and 104E of the first superlattice 104, the mole fraction of Ge, y, is 0.03, 0.06, 0.09, 0.012, and 0.15 respectively. The mole fraction of Ge, z, for each of second superlattice layers 108A, 108B, 108C, 108D and 108E is 0.015, 0.012, 0.009, 0.006 and 0.003 respectively.

A 0.1–0.2 μm layer 110 of n Silicon doped with As to a density of $10^{17}/cm^3$ is grown on the second superlattice 108. Finally, a 20–50 Å layer 112 of n+ GaP is grown on N+Silicon layer 110, in the {211} orientation. This final layer 112 is doped with silicon to $10^{20}/cm^3$.

Figure 2B:
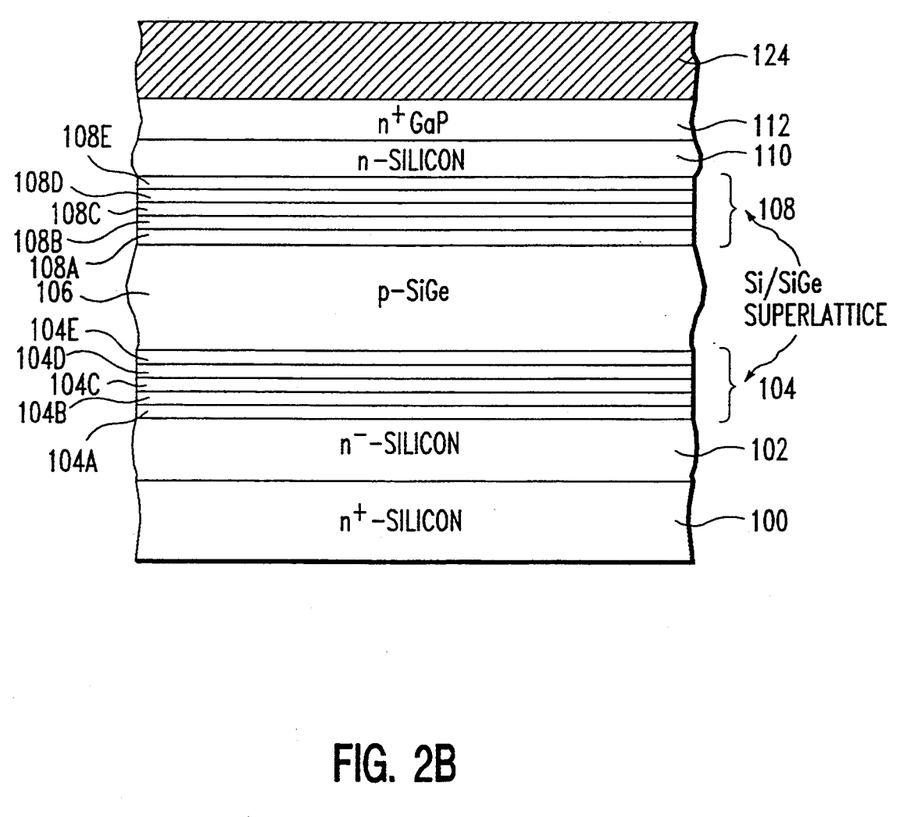
Figure 2C:
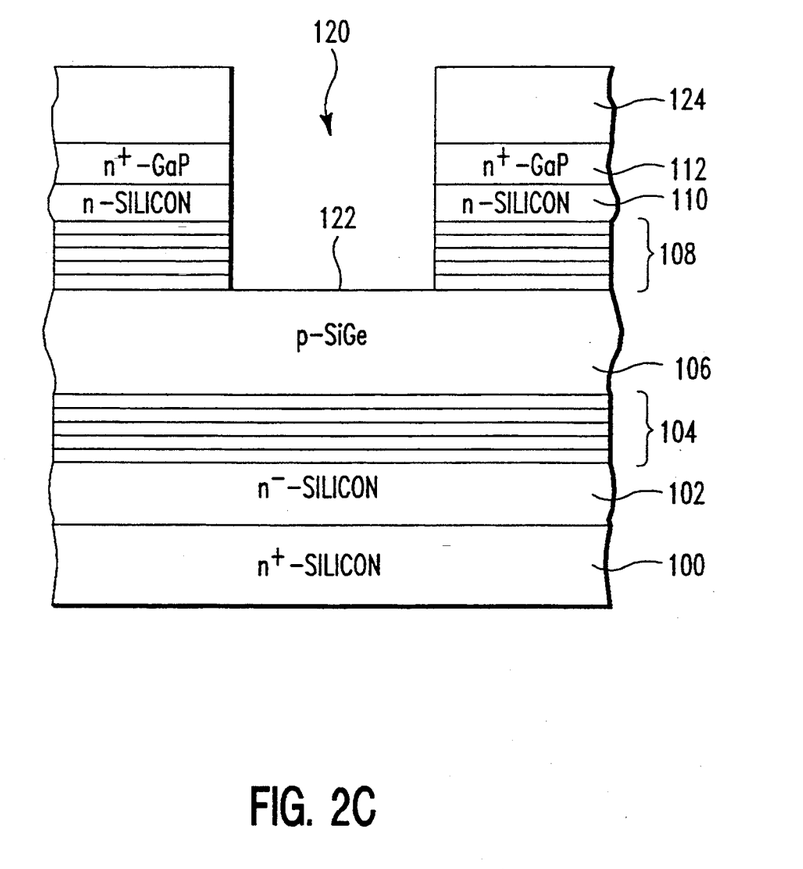

The preferred embodiment THBT is formed in the layered structure after growing final layer 112. First, an oxide-nitride layer 124, in FIG. 2B is formed on Gap layer 112. A squared groove, 120 in FIG. 2C, is anisotropically etched into the final layer 112 through the oxide-nitride layer 124. The groove 120 must be deep enough to expose a portion of the top surface 122 of P type SiGe layer 106. An oxide-nitride layer 124 provides an etch mask and protects unetched areas. The preferred etchant for GaP layer 112 is methane or ethane gas. A chlorine based gas is the preferred etchant for the silicon and SiGe superlattice layers.

Figure 2D:
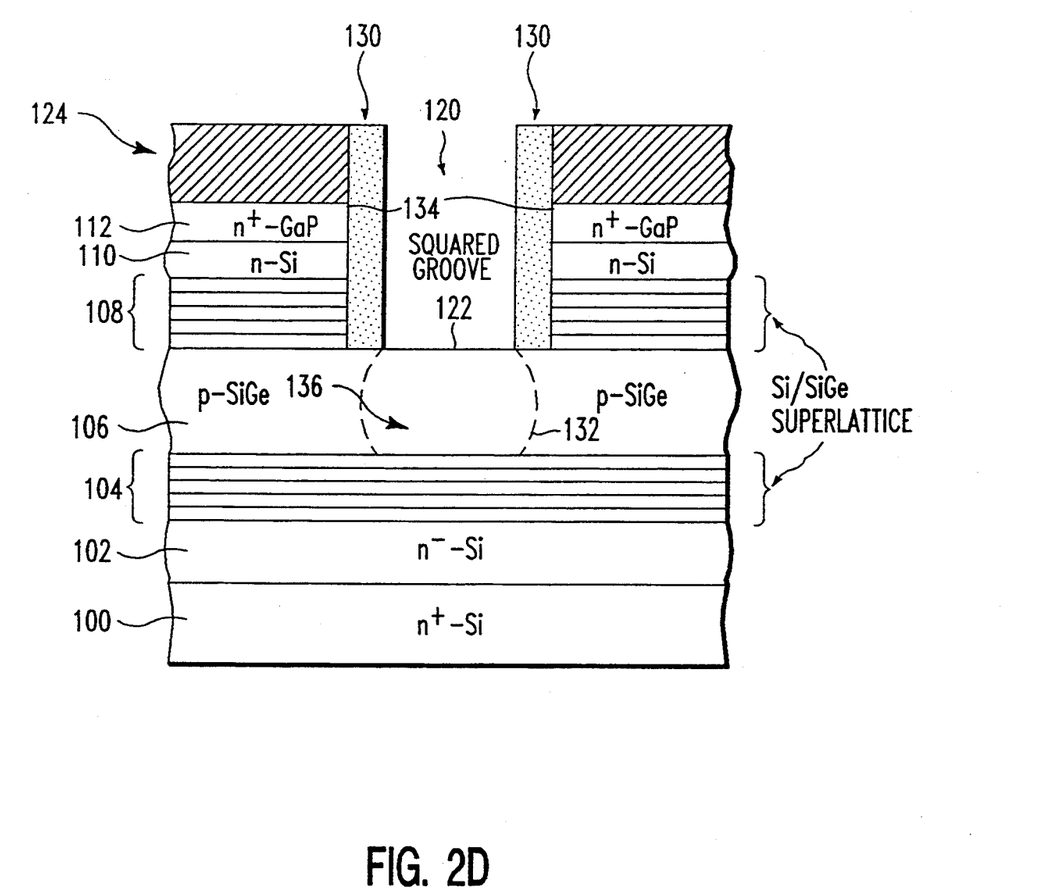
Figure 2E:
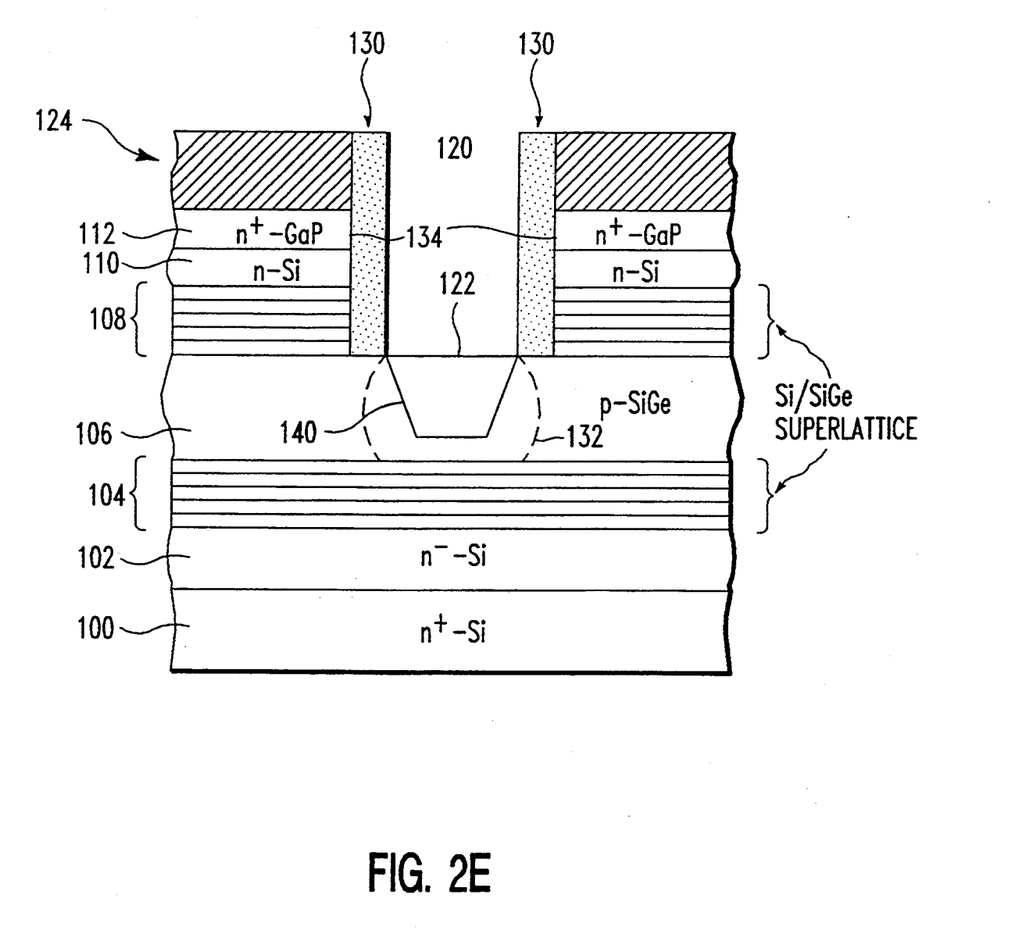
Figure 2F:
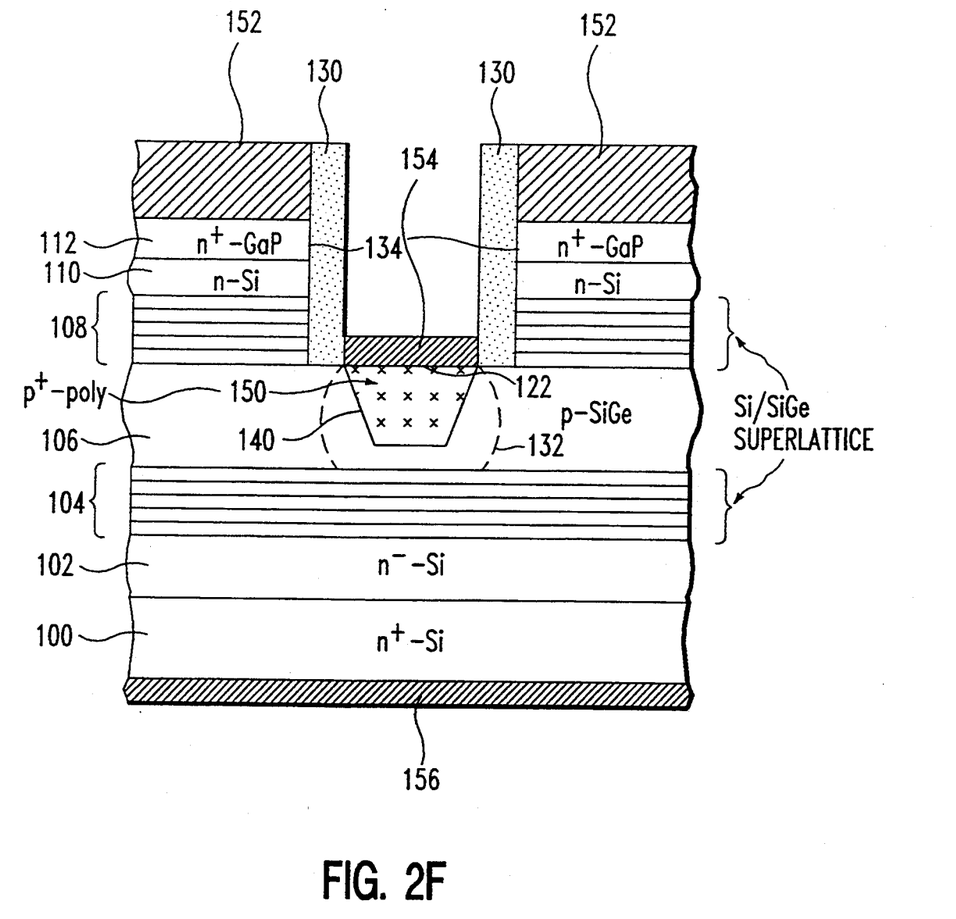
Figure 2G:
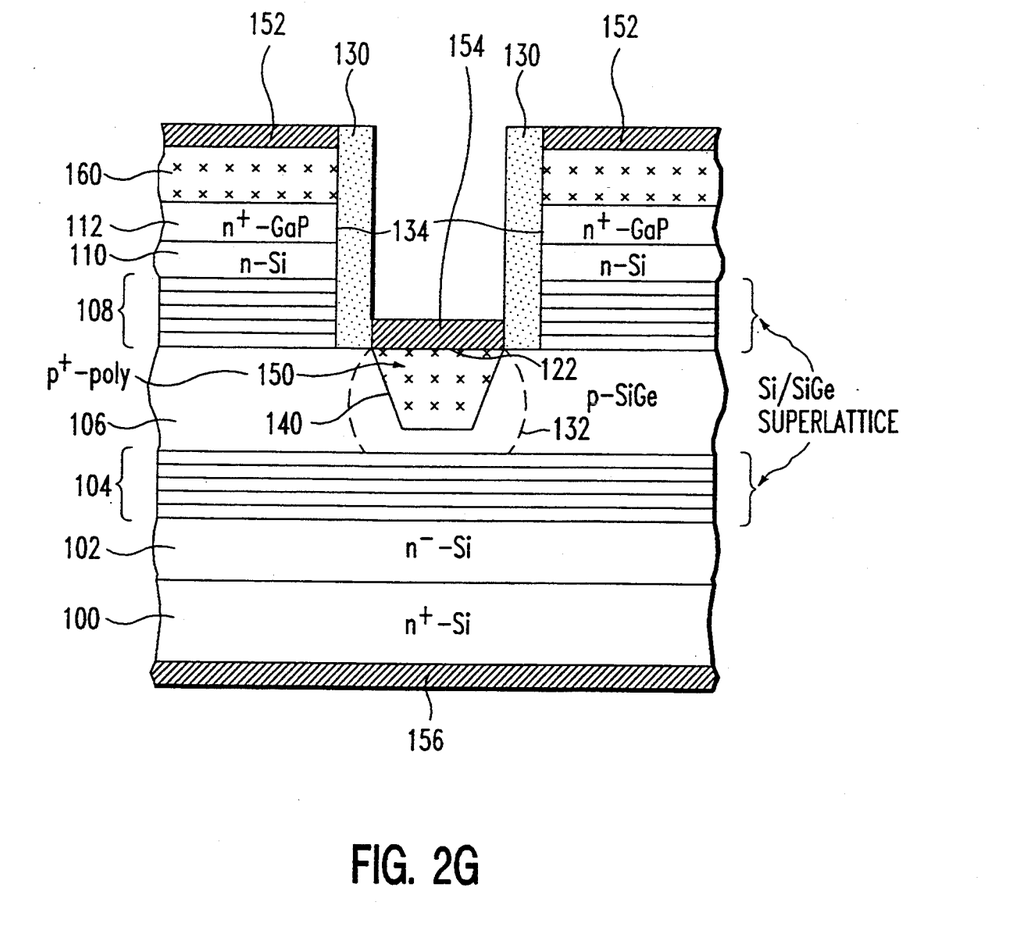

Next, a $SiO_2$ layer 130 is deposited on the side walls 134 of the squared groove 120 as in FIG. 2D. Boron is ion implanted into the top surface 122 of P type SiGe layer 106 forming region 132. The dopant density of region 132 is raised to $5 \times 10^{19}/cm^3$. The ion implanted structure is then annealed to repair surface damage that occurred during ion implantation. After annealing, a V-shaped groove, 140 in FIG. 2E is asymmetrically etched from exposed surface 122 into region 132. Polysilicon, 150 in FIG. 2F, is deposited in the V-shaped groove 140 and the Oxide-Nitride Pad 124 is etched away. The region 132 forms the extrinsic base of the THBT. The THBT's extrinsic base is self aligned by the squared groove 120. Self alignment limits Boron outdiffusion from region 132 delineated by the dotted line into the area 106. Thus, this type of self alignment, not found in prior art HBT, protects extrinsic base areas, under the emitter regions, from being contaminated and, consequently, mobile emitter carriers do not laterally diffuse into the extrinsic base and be trapped or recombined. Finally, metal is deposited to form emitter contacts 152, base contact 154 and a collector contact 156. Alternatively, 1000–3000 Å polysilicon layer 160 in FIG. 2G is deposited on layer 112 prior to depositing metal emitter contacts 152 and then, the polysilicon is doped with N type dopant to a dopant density of $10^{19}$ to $10^{21}/cm^3$.

Thus, the NPN THBT of the preferred embodiment transistor has an emitter of layers 110, 112 and superlattice 108; a base of layer 106; a collector with superlattice 104 and layer 102; and a subcollector of layer 100. Alternatively, a PNP THBT can be fabricated following the same fabrication steps, but substituting conventional P-type dopants for N-type and vice versa.

In another preferred embodiment, the superlattice and base layer mole fractions of Ge are identical, i.e., x=y=z in both superlattice structures and the base. Instead of varied mole fractions, the superlattice layers' quantum well thickness monotonically increases or decreases. For example, the quantum well thickness for 104A-E would be 30, 25, 20, 15 and 10 Å, respectively, and, for 108A-E 10, 15, 20, 25 and 30 Å respectively. In both embodiments, due to the lattice mismatch, the strains normally are significantly reduced in the superlattices between Si and SiGe.

Figure 3:
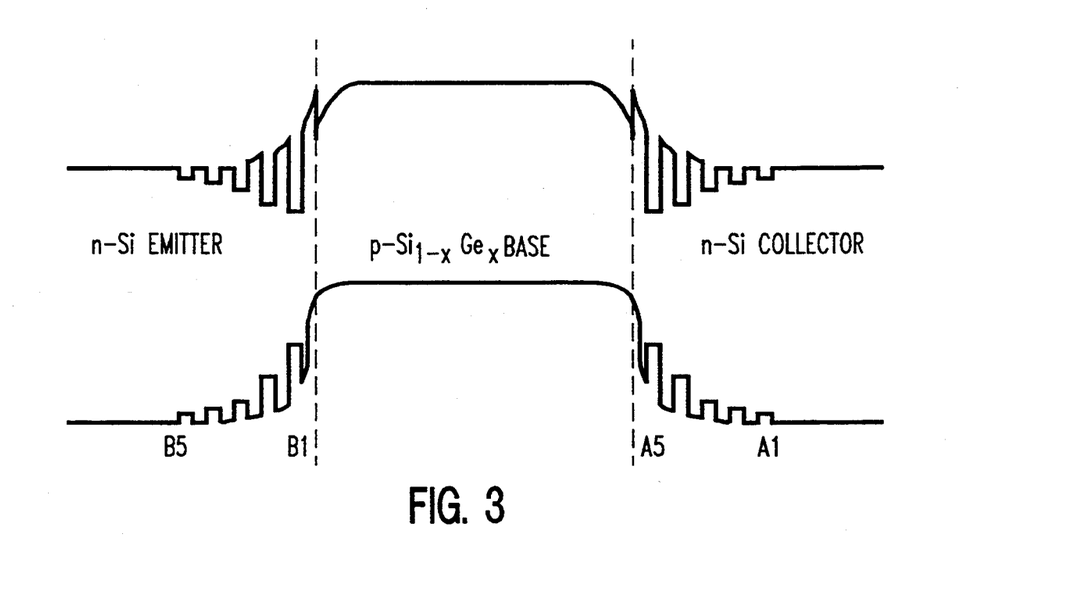
FIG. 3 is bandgap diagram of a triple heterojunction bipolar transistor (THBT) according to the preferred embodiment of the present invention.

The advantage of this new transistor can be understood from the bandgap diagram, FIG. 3., of the first preferred embodiment THBT. Mobile carriers are physically separated from their parent atoms when moving from wide gap areas to the narrow quantum well areas (demarcated by discontinuities at the Si/SiGe layer interface) of the superlattice. That separation enhances carrier mobility in the intended direction of current flow and retards carrier mobility in the opposite direction. Further, the superlattice prevents high junction capacitance and minimizes outdiffusion from emitter layer 110 into the base layer 106.

In the preferred embodiment THBT, the emitter doping density is higher at the emitter contact than at the emitter-base (e-b) junction. The conduction band discontinuity $\Delta E_c$ and the valence band discontinuity $\Delta E_v$ at the Si/GaP junction interface are about 0.61 and 0.60 eV respectively, allowing the majority carriers to tunnel through GaP film 112. Emitter resistance remains low because GaP film 112 does not create a high enough potential barrier to majority carriers. Thus, the sandwiched emitter structure of the present invention is suitable for high frequency operations.

Further, the THBT of the present invention has lower base current leakage for two reasons. First, the bandgap discontinuity provided by the GaP/Si interface blocks low energy electrons from entering the base. Thus, DC current gain is increased. Second, majority carriers from the base (holes) are also blocked by the GaP/Si interface and also by the $Si/Si_{1-x}Ge_x$ interface. This also improves the DC current gain.

While the present invention has been described herein in terms of the above preferred embodiments, modifications and variations will occur to a person of ordinary skill in the art without departing from the scope and spirit of the invention.

I claim:

1. A Heterojunction Bipolar Transistor (HBT) comprised of:
   a first superlattice in a collector region;
   a second superlattice in an emitter region;
   a base layer between said emitter and said collector region; and
   said first and said second superlattice comprising:
   alternating layers of a first and a second semiconductor material,
   said first semiconductor material is silicon and said second semiconductor material is SiGe, and
   the mole fraction of Ge in said SiGe material being monotonically decreasing in the direction away from the base layer in said collector region and in said emitter region.

2. The HBT of claim 1 wherein said base layer is adjacent said superlattice layers.

3. The HBT of claim 1 wherein said base layer is of said second semiconductor material.

4. The HBT of claim 3 wherein said emitter region includes a layer of GaP.

5. The HBT of claim 1 wherein said emitter and collector regions are N type and said base layer is P type.

6. The HBT of claim 4 wherein said emitter and collector regions are N type and said base layer is P type.

7. The HBT of claim 1 wherein said emitter and collector regions are P type and said base layer is N type.

8. The HBT of claim 4 wherein said emitter and collector regions are P type and said base layer is N type.

* * * * *